(12) United States Patent
Walker et al.

(10) Patent No.: US 11,726,123 B2
(45) Date of Patent: *Aug. 15, 2023

(54) ELECTROMETER SENSOR CONTROL SYSTEM

(71) Applicant: NORTHROP GRUMMAN SYSTEMS CORPORATION, Falls Church, VA (US)

(72) Inventors: Thad G. Walker, Middleton, WI (US); Eric A. Imhof, Albuquerque, NM (US); Steven Ryan Jefferts, Woodland Hills, CA (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/552,873

(22) Filed: Dec. 16, 2021

(65) Prior Publication Data

US 2022/0196719 A1    Jun. 23, 2022

Related U.S. Application Data

(60) Provisional application No. 63/126,691, filed on Dec. 17, 2020, provisional application No. 63/126,970, filed on Dec. 17, 2020.

(51) Int. Cl.
   *G01R 29/12* (2006.01)
(52) U.S. Cl.
   CPC .................. *G01R 29/12* (2013.01)
(58) Field of Classification Search
   CPC .................. G01R 29/12; G01R 29/0885

USPC ......................................................... 324/105
See application file for complete search history.

(56) References Cited

U.S. PATENT DOCUMENTS

| 4,147,979 A | * | 4/1979 | Baues | G01R 29/12 385/12 |
| 2016/0363617 A1 | * | 12/2016 | Anderson | G01R 29/0885 |
| 2019/0072600 A1 | * | 3/2019 | Schubert | H01S 5/0657 |

(Continued)

OTHER PUBLICATIONS

Kim, Bongjune, et al. "A weakly-interacting many-body system of Rydberg polaritons based on electromagnetically induced transparency." Communications Physics 4.1 (2021): 1-8. (Year: 2021).*

(Continued)

*Primary Examiner* — Christopher P McAndrew
(74) *Attorney, Agent, or Firm* — Tarolli, Sundheim, Covell & Tummino LLP (57) ABSTRACT

One embodiment includes an electrometer system. The system includes a sensor cell comprising alkali metal atoms within, and a probe laser configured to generate a probe beam, the probe beam being provided through the sensor cell. The system also includes a coupling laser configured to generate a coupling beam. The coupling beam can be provided through the sensor cell to combine with the probe beam provided through the sensor cell to provide a Rydberg energy state of the alkali metal atoms, the probe beam exiting the sensor cell as a detection beam. The system further includes a sensor control system configured to monitor the detection beam to detect an external signal based on monitoring a phase of the detection beam.

20 Claims, 4 Drawing Sheets

(56) References Cited

U.S. PATENT DOCUMENTS

2020/0295838 A1 9/2020 Gordon et al.
2020/0357534 A1 11/2020 Larsen et al.

OTHER PUBLICATIONS

International Search Report for corresponding PCT/US2021/063824, dated Apr. 12, 2022; attached herewith.

* cited by examiner

ELECTROMETER SENSOR CONTROL SYSTEM

CROSS REFERENCE TO RELATED APPLICATION

This application claims priority from U.S. Provisional Patent Application No. 63/126,970, filed 17 Dec. 2020, and from U.S. Provisional Patent Application No. 63/126,691, filed 17 Dec. 2020, which are both incorporated herein by reference in their entirety.

TECHNICAL FIELD

The present invention relates generally to sensor systems, and specifically to an electrometer sensor control system.

BACKGROUND

Electric field measurement via electrometers has many useful applications. Detectable electric fields can include DC electric fields, as well as AC electric fields (e.g., radio frequency (RF) fields which can correspond to communications signals). The detection of electric fields can be implemented for anti-spoofing and and/or anti-jamming capability in electronic warfare environments. For example, if a jamming or spoofing signal can be detected, then the jamming signal or spoofing signal can be filtered or demodulated out to provide for a baseband signal of interest without undesired or adversarial interference. As an example, multiple antennas arranged in an array can provide for directional detection of a signal, such as to provide a detectable directional of a source of the signal.

SUMMARY

One embodiment includes an electrometer system. The system includes a sensor cell comprising alkali metal atoms within, and a probe laser configured to generate a probe beam, the probe beam being provided through the sensor cell. The system also includes a coupling laser configured to generate a coupling beam. The coupling beam can be provided through the sensor cell to combine with the probe beam provided through the sensor cell to provide a Rydberg energy state of the alkali metal atoms, the probe beam exiting the sensor cell as a detection beam. The system further includes a sensor control system configured to monitor the detection beam to detect an external signal based on monitoring a phase of the detection beam.

Another example includes a method for detecting an external signal via an electrometer system. The method includes directing a probe beam through a sensor cell comprising an alkali metal atoms in a first direction and directing a coupling beam through the sensor cell collinearly and anti-parallel with the probe beam to provide a Rydberg energy state of the alkali metal atoms. The method also includes providing a splitting signal having a predetermined frequency through the sensor cell to provide a pair of Autler-Townes frequency-spectrum transparency peaks about the Rydberg energy state associated with the alkali metal atoms. The method further includes monitoring a phase of a detection beam relative to at least one of the pair of Autler-Townes frequency-spectrum transparency peaks to detect the external signal, the detection beam corresponding to the probe beam exiting the sensor cell.

Another example includes electrometer system. The system includes a probe laser configured to generate a probe beam and a coupling laser configured to generate a coupling beam that is provided through the sensor cell. The system also includes a splitting signal generator configured to generate a splitting signal having a predetermined frequency through the sensor cell to provide a pair of Autler-Townes frequency-spectrum transparency peaks associated with the alkali metal atoms. The system further includes a sensor control system configured to split the probe beam into a first probe beam and a second probe beam that are each provided through the sensor cell as a combined optical beam and exiting the sensor cell as a detection beam. The first and second probe beams can have respective frequencies that are approximately equal to frequencies associated with the respective pair of Autler-Townes frequency-spectrum transparency peaks. The combined optical beam and the coupling beam can provide a Rydberg energy state of the alkali metal atoms. The sensor control system can be further configured to monitor a phase of the detection beam with respect to at least one of the Autler-Townes frequency-spectrum transparency peaks to detect an external signal.

DETAILED DESCRIPTION

The present invention relates generally to sensor systems, and specifically to an electrometer sensor control system. The electrometer system can include a sensor cell containing a vapor of alkali metal atoms enclosed within. The electrometer system also includes a probe laser and at least one coupling laser that are configured to generate a probe beam and a respective at least one coupling beam, respectively. Each of the probe beam and the coupling beam(s) can be provided through the sensor cell via a set of optics, such that the probe beam and the coupling beam(s) can be arranged collinearly and anti-parallel with each other. For example, the probe beam and the coupling beam(s) can be tuned to respective frequencies to provide a Rydberg energy state of the alkali metal vapor.

The electrometer system also includes a splitting signal generator configured to generate a splitting signal having a predetermined frequency and a predetermined amplitude through the sensor cell. As an example, the splitting signal generator can provide the splitting signal to split a frequency-spectrum transparency peak corresponding to the Rydberg energy state of the alkali metal atoms into a pair of Autler-Townes frequency-spectrum transparency peaks about the Rydberg energy state associated with the alkali metal atoms, such as for a frequency of the splitting signal approximately equal to the energy difference between the Rydberg energy state and a second Rydberg energy state. The splitting signal can be set to a frequency, for example, that corresponds to a frequency of an external signal that is desired to be detected by the electrometer system.

The electrometer system further includes a sensor control system configured to monitor a phase of a detection beam to detect the external signal. The sensor control system can split the probe beam into multiple probe beams. A first probe beam can be implemented to lock a frequency of the probe laser. A second probe beam and a third probe beam can be modulated to have frequencies that are approximately equal to the Autler-Townes frequency-spectrum transparency peaks, and can be combined to provide a combined probe beam through the sensor cell. The combined probe beam exiting the sensor cell can correspond to the detection beam, which can be combined with a fourth probe beam. The sensor control system can include a plurality of photodetectors that can monitor intensities of the first, second, and third probe beams, as well as the combined probe beam and the combination of the detection beam and the fourth probe beam. The photodetectors can thus be implemented to cancel power, phase, and frequency fluctuations of the separate probe beams. Furthermore, the signals provided from the photodetectors can be implemented to solve for phase changes of the second and third probe beams relative to the Autler-Townes frequency-spectrum transparency peaks to identify a change in the Autler-Townes frequency-spectrum transparency peaks corresponding to the presence of the external signal.

Figure 1:
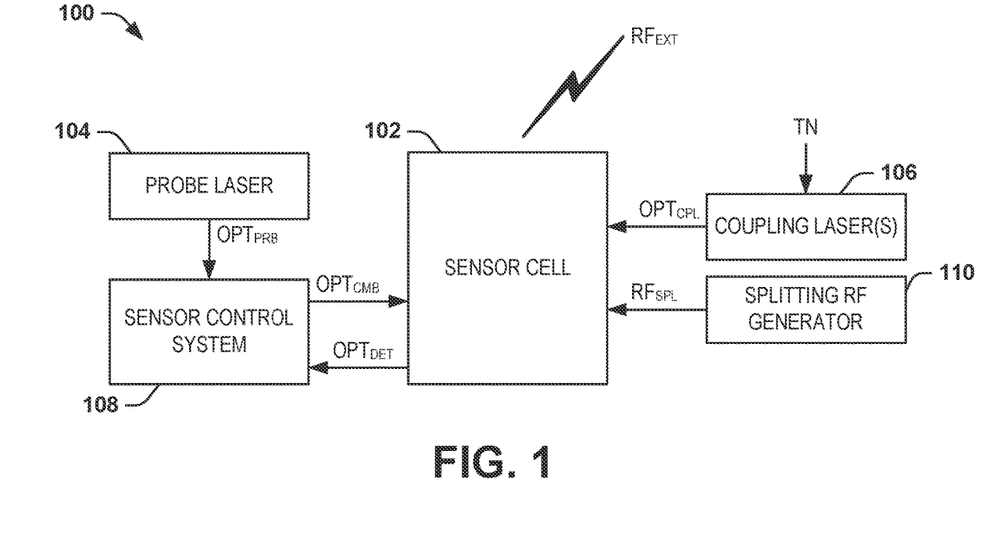
FIG. 1 illustrates an example diagram of an electrometer system.

FIG. 1 illustrates an example diagram of an electrometer system 100. The electrometer system 100 can be implemented in any of a variety of applications, such as to detect an external electromagnetic signal of any frequency.

The electrometer system 100 includes a sensor cell 102 that can be configured as a sealed glass container that includes a vapor of alkali metal atoms. As an example, the alkali metal vapor can be rubidium (Rb), or any of a variety of other types of alkali metals (e.g., cesium (Cs)). As described herein, the alkali metal vapor can be excited to a Rydberg state, such that the alkali metal vapor can be substantially insensitive to absorption of photons of light of a specific frequency (e.g., is approximately transparent). The electrometer system 100 also includes a probe laser 104 that is configured to generate a probe beam $OPT_{PRB}$ and at least one coupling laser 106 that is configured to generate a respective at least one coupling beam $OPT_{CPL}$. For example, the at least one coupling beam OPTCPL can include a first coupling beam and a second coupling beam that are tuned to different frequencies relative to each other and to the probe beam $OPT_{PRB}$. In the example of FIG. 1, the probe beam $OPT_{PRB}$ is provided to a sensor control system 108. The sensor control system 108 is configured to split the probe beam $OPT_{PRB}$ into a plurality of different beams, as described in greater detail herein. In the example of FIG. 1, the sensor control system 108 can generate a combined probe beam $OPT_{CMB}$ that includes a plurality (e.g., a pair) of the split versions of the probe beam $OPT_{PRB}$. As an example, the combined probe beam $OPT_{CMB}$ can include a first probe beam and a second probe beam that have respective frequencies that are approximately equal and opposite a Rydberg transition frequency of the alkali metal atoms.

In the example of FIG. 1, the combined probe beam $OPT_{CMB}$ and the coupling beam(s) $OPT_{CPL}$ are provided through the sensor cell 102 via optics (not shown) in a manner such that the combined probe beam $OPT_{CMB}$ and the coupling beam(s) $OPT_{CPL}$ can each be collimated (e.g., via optics) and provided collinearly and anti-parallel with respect to each other. As an example, the combined probe beam $OPT_{CMB}$ and the coupling beam(s) $OPT_{CPL}$ can be tuned to respective frequencies to provide a Rydberg energy state of the alkali metal vapor, such that the alkali metal vapor is excited to populate the Rydberg energy state. The combined probe beam $OPT_{CMB}$ can exit the sensor cell 102 as a detection beam $OPT_{DET}$.

The electrometer system 100 also includes a splitting signal generator 110 that is configured to generate a splitting signal $RF_{SPL}$. The splitting signal $RF_{SPL}$ can be a radio frequency (RF) signal that is provided at a predetermined frequency and a predetermined amplitude through the sensor cell 102. As an example, the splitting signal generator 110 can provide the splitting signal $RF_{SPL}$ to provide a pair of Autler-Townes frequency-spectrum transparency peaks associated with the alkali metal atoms. The splitting signal $RF_{SPL}$ can be set to a frequency, for example, that corresponds to a frequency of an external signal that is desired to be detected by the electrometer system. As an example, the combined probe beam $OPT_{CMB}$ can include a first probe beam and a second probe beam that have respective frequencies that are approximately equal to the respective frequencies of the pair of Autler-Townes frequency-spectrum transparency peaks.

The sensor control system 108 is configured to monitor the detection beam $OPT_{DET}$ to detect the external signal $RF_{EXT}$. The sensor control system 108 can include a photodetector that can monitor a phase of the detection beam $OPT_{DET}$ to detect respective phase shifts of the split versions of the probe beam $OPT_{PRB}$ that constitute the combined probe beam $OPT_{CMB}$ relative to the respective pair of Autler-Townes frequency-spectrum transparency peaks. The sensor control system 108 can thus determine a change in the pair of Autler-Townes frequency-spectrum transparency peaks that correspond to the presence of the external signal. As a result, an external signal $RF_{EXT}$ having a frequency that is approximately equal to the frequency of the splitting signal $RF_{SPL}$ can be detected. As described in greater detail herein, the sensor control system 108 can monitor the optical signals that are provided from the splitting of the probe beam $OPT_{PRB}$ to substantially cancel sources of noise in the measurement of the phase, such as to cancel power, phase, and frequency fluctuations of the separate probe beams to calculate the phase of the detection beam $OPT_{DET}$ with respect to the pair of Autler-Townes frequency-spectrum transparency peaks.

Figure 2:
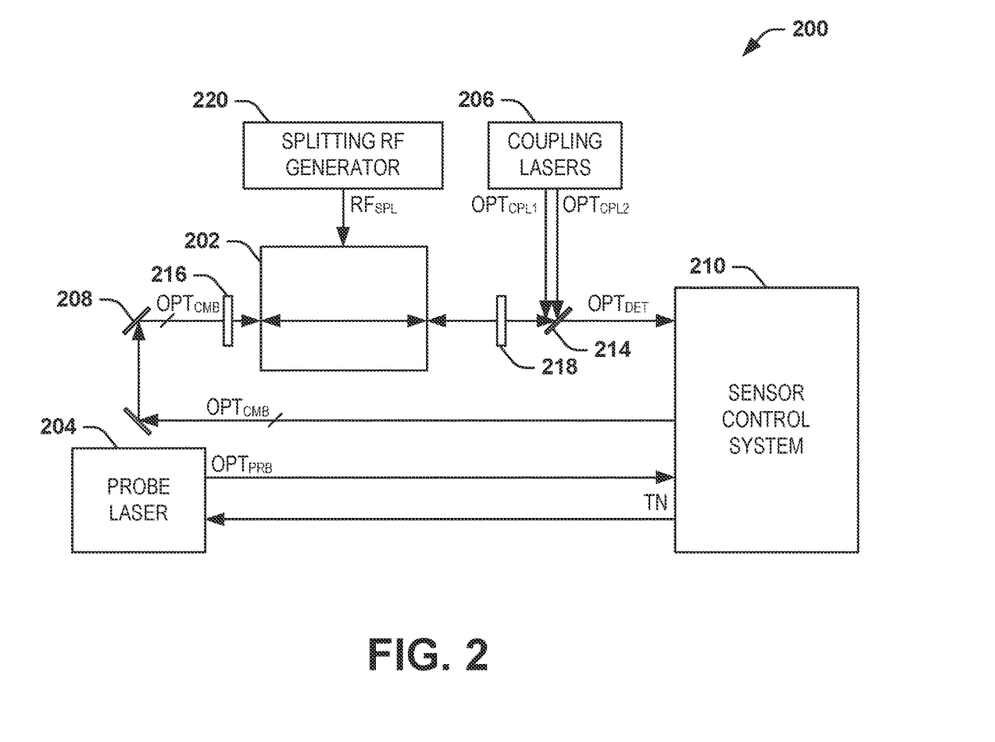
FIG. 2 illustrates another example diagram of an electrometer system.

FIG. 2 illustrates another example diagram of an electrometer system 200. The electrometer system 200 can be implemented in any of a variety of applications in which detection of an external signal $RF_{EXT}$ is desired.

The electrometer system 200 includes a sensor cell 202 that can be configured as a sealed glass container that includes an alkali metal vapor. The electrometer system 200 also includes a probe laser 204 that is configured to generate a probe beam $OPT_{PRB}$ and a set of coupling lasers 206 (e.g., including a first coupling laser and a second coupling laser) that are configured to generate a first coupling beam $OPT_{CPL1}$ and a second coupling beam $OPT_{CPL2}$. The probe beam $OPT_{PRB}$ is provided to a sensor control system 210. The sensor control system 210 is configured to split the probe beam $OPT_{PRB}$ into a plurality of different beams, as described in greater detail herein. Similar to as described above in the example of FIG. 1, the sensor control system 210 can generate a combined probe beam $OPT_{CMB}$ that includes a first probe beam and a second probe beam corresponding to split versions of the probe beam $OPT_{PRB}$. The first and second probe beams that form the combined probe beam $OPT_{CMB}$ can have respective frequencies that are approximately equal and opposite a Rydberg transition frequency of the alkali metal atoms, such as approximately aligned with a pair of Autler-Townes frequency-spectrum transparency peaks.

In the example of FIG. 2, the combined probe beam $OPT_{CMB}$ is provided to the sensor cell 202 via optics, demonstrated generally at 212. Similarly, the coupling beams $OPT_{CPL1}$ and $OPT_{CPL2}$ are provided to a beam splitter 214 (e.g., polarization beam splitter) that is configured to reflect the coupling beams $OPT_{CPL1}$ and $OPT_{CPL2}$ into the sensor cell 202 and to pass the combined probe beam $OPT_{CMB}$ through it as a detection beam $OPT_{DET}$ that is monitored by a sensor control system 210. In the example of FIG. 2, the coupling beams $OPT_{CPL1}$ and $OPT_{CPL2}$ are demonstrated separately, but additional optics can provide the coupling beams $OPT_{CPL1}$ and $OPT_{CPL2}$ as being collinear with respect to each other. Similarly, the combined probe beam $OPT_{CMB}$ can correspond to two probe beams that are provided collinearly with respect to each other. As described in greater detail herein, the probe beam $OPT_{PRB}$ and the coupling beams $OPT_{CPL1}$ and $OPT_{CPL2}$ can be tuned to respective frequencies to provide a Rydberg energy state of the alkali metal vapor.

Based on the arrangement of the beam splitter 214, the probe beam $OPT_{PRB}$ and the coupling beam(s) $OPT_{CPL}$ can be provided through the sensor cell 202 in a manner such that the probe beam $OPT_{PRB}$ and the coupling beam(s) $OPT_{CPL}$ are collinear and anti-parallel with respect to each other through the sensor cell 202, demonstrated in the example of FIG. 2 at 214. Additionally, the electrometer system 200 includes collimating optics 216 (e.g., a lens) that can collimate the combined probe beam $OPT_{CMB}$ along a specific axis in the sensor cell 202, and collimating optics 218 (e.g., a lens) that can collimate the coupling beams $OPT_{CPL1}$ and $OPT_{CPL2}$ along the specific axis in the sensor cell 202, such that the collimation of each of the combined probe beam $OPT_{CMB}$ and the coupling beams $OPT_{CPL1}$ and $OPT_{CPL2}$ can be provided along the same axis in a collinear and anti-parallel manner. Alternatively, the electrometer system 200 can include focusing optics to focus each of the combined probe beam $OPT_{CMB}$ and the coupling beams $OPT_{CPL1}$ and $OPT_{CPL2}$ to be collocated in the sensor cell 202 at a measurement point. Accordingly, the combined probe beam $OPT_{CMB}$ can be set to excite the alkali metal vapor to a first excited state, and the frequency of the coupling beams $OPT_{CPL1}$ and $OPT_{CPL2}$ can be set to stimulate the excited alkali metal vapor to the Rydberg energy state, and thus to an electromagnetically-induced transparency. As a result, the alkali metal atoms in the Rydberg energy state can be transparent with respect to absorption by light at the approximate frequency of the probe beam $OPT_{PRB}$.

The electrometer system 200 also includes a splitting signal generator 220 that is configured to generate a splitting signal $RF_{SPL}$. The splitting signal $RF_{SPL}$ can be an RF signal that is provided at a predetermined frequency and a predetermined amplitude through the sensor cell 202. As an example, the splitting signal generator 220 can provide the splitting signal $RF_{SPL}$ to provide a pair of Autler-Townes frequency-spectrum transparency peaks associated with the alkali metal atoms when the frequency of the splitting signal $RF_{SPL}$ is approximately equal to the energy difference between the Rydberg energy state and a second Rydberg energy state. The splitting signal $RF_{SPL}$ can be set to a frequency, for example, that corresponds to a frequency of an external signal that is desired to be detected by the electrometer system.

The sensor control system 210 is configured to monitor the detection beam $OPT_{DET}$ to detect the external signal $RF_{EXT}$. The sensor control system 210 can include a plurality of photodetectors that can monitor the different split versions of the probe beam $OPT_{PRB}$, including combinations thereof, at the input and the output of the sensor cell 202.

One of the photodetectors can monitor a phase of the detection beam $OPT_{DET}$ to detect respective phase shifts of the split versions of the probe beam $OPT_{PRB}$ that constitute the combined probe beam $OPT_{CMB}$ relative to the respective pair of Autler-Townes frequency-spectrum transparency peaks. The sensor control system 108 can thus determine a change in the pair of Autler-Townes frequency-spectrum transparency peaks that correspond to the presence of the external signal based on relative phase shifts of the first and second versions of the split probe beam $OPT_{PRB}$ that form the combined probe beam $OPT_{CMB}$. As a result, an external signal $RF_{EXT}$ having a frequency that is approximately equal to the frequency of the splitting signal $RF_{SPL}$ can be detected. In addition, as described in greater detail herein, the sensor control system 210 can monitor the optical signals that are provided from the splitting of the probe beam $OPT_{PRB}$ to substantially cancel sources of noise in the measurement of the phase, such as to cancel power, phase, and frequency fluctuations of the separate probe beams to calculate the phase of the detection beam $OPT_{DET}$ with respect to the pair of Autler-Townes frequency-spectrum transparency peaks.

Figure 3:
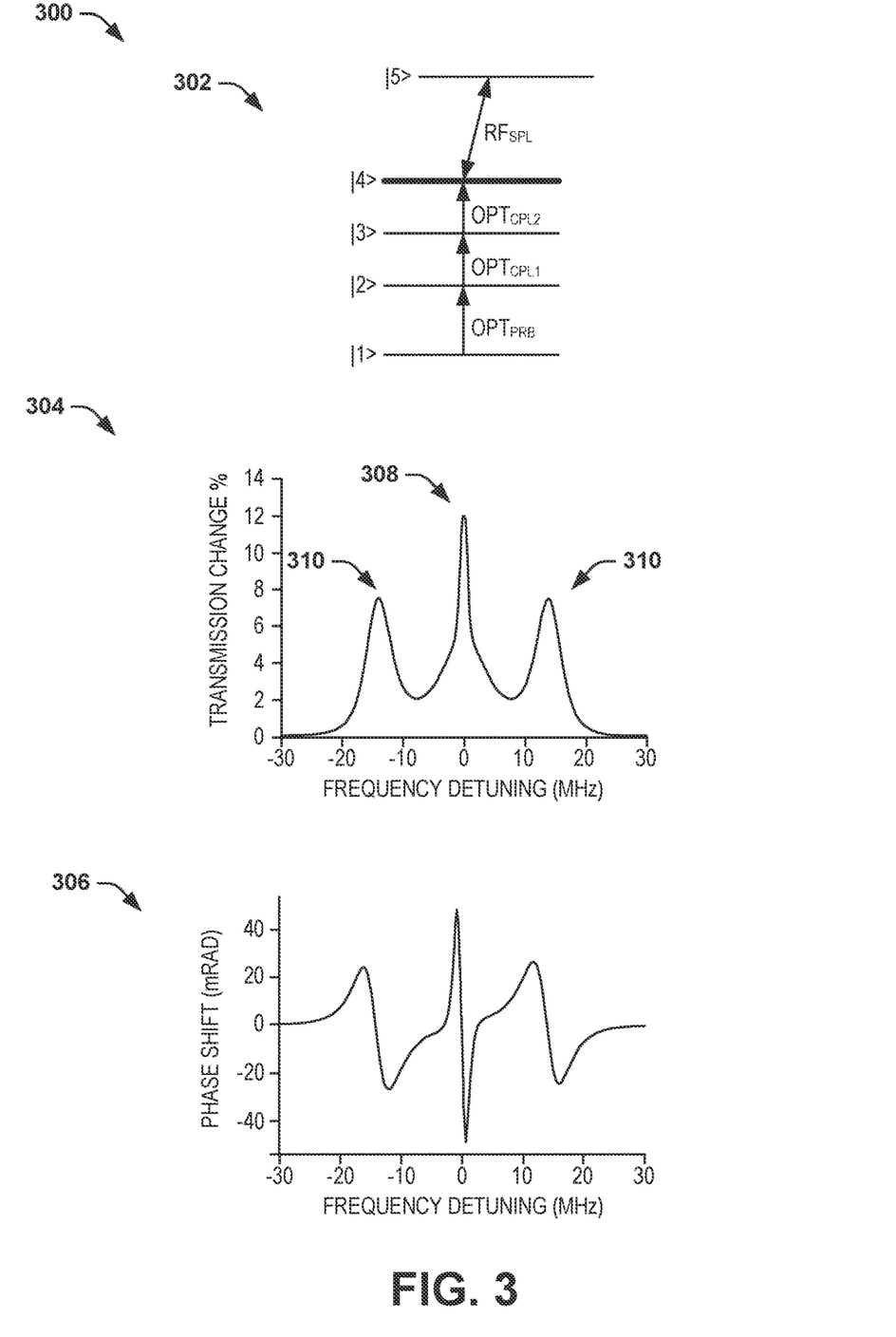
FIG. 3 illustrates an example diagram of optical detection.

FIG. 3 illustrates an example diagram 300 of optical detection. The diagram 300 includes an energy state diagram 302, a graph 304 that demonstrates a percentage of transmission change of the detection beam $OPT_{DET}$ plotted as a function of frequency detuning (in Megahertz) from the |1> to |2> energy level transition frequency, and a graph 306 that demonstrates phase shift of the detection beam $OPT_{DET}$ plotted as a function of frequency detuning (in Megahertz) from the |1> to |2> energy level transition frequency. The diagram 300 can correspond to optical detection in the electrometer system 200. Therefore, reference is to be made to the example of FIG. 2 in the following description of the example of FIG. 3.

The energy state diagram 302 demonstrates a first energy state (e.g., ground state) |1> at which the alkali metal atoms can begin. As an example, for the alkali metal atoms being rubidium, the first energy state can be $|5S_{1/2}>$. In response to the combined probe beam $OPT_{CMB}$, a population of the alkali metal atoms can be excited to a first excited state |2>. As an example, the first and second probe beams that form the combined probe beam $OPT_{CMB}$ can have respective wavelengths that are approximately centered on 780 nanometers. Therefore, the first excited state |2> for rubidium atoms can correspond to $|5P_{3/2}>$. In response to the first coupling beams $OPT_{CPL1}$, a population of the excited alkali metal atoms can be further excited to a second excited state |3>. As an example, the first coupling beam $OPT_{CPL1}$ can have a wavelength of approximately 776 nanometers, such that the second excited state |3> can be $|5D_{5/2}>$. In response to the second coupling beams $OPT_{CPL2}$, a population of the excited alkali metal atoms can be further excited to a first Rydberg energy state |4> can be transparent with respect to absorption by light at the approximate frequency of the probe beam $OPT_{PRB}$. Furthermore, as described above, the splitting signal $RF_{SPL}$ can be provided to the sensor cell 202, which can result in a quantum superposition of the alkali metal atoms in the first Rydberg energy state |4> and a second Rydberg energy state |5>. If the splitting signal $RF_{SPL}$ has a frequency that is approximately equal to an energy difference between the Rydberg energy state |4> and the second Rydberg energy state |5>, then the Autler-Townes pair of transparency peaks in the frequency spectrum can be well defined and detectable.

The graph 304 plots a percentage of transmission change of the detection beam $OPT_{DET}$ plotted as a function of frequency detuning (in Megahertz) from the |1> to |2> transition frequency. In the example of FIG. 3, the graph 304 is centered at zero frequency detuning, at which a transparency peak is exhibited corresponding to an electromagnetically induced transparency between states |1>, |2>, and |3>, demonstrated generally at 308.

Based on the interaction of the alkali metal atoms with the combined probe beam $OPT_{CMB}$, the coupling beams $OPT_{CPL1}$ and $OPT_{CPL2}$, and the splitting signal $RF_{SPL}$, the alkali metal atoms can exhibit transitions between the first and second Rydberg states |4> and |5>. Thus, the addition of the splitting signal $RF_{SPL}$ can provide a pair of Autler-Townes transparency peaks, demonstrated generally at 310. In the example of FIG. 3, the Autler-Townes transparency peaks are located approximately equal and opposite, approximately +15 MHz and −15 MHz detuned from, the transparency peak at zero detuning, which can be based on the frequency of the splitting signal $RF_{SPL}$. Therefore, the Autler-Townes transparency peaks 310 are demonstrated as having a much greater transmissivity of the detection beam $OPT_{DET}$, such that the alkali metal vapor can be substantially insensitive to absorption of the photons of the combined probe beam $OPT_{CMB}$ at each of the two detuned frequencies approximately +15 MHz and −15 MHz detuned from, the transparency peak at zero detuning.

The graph 306 plots a phase shift of the detection beam $OPT_{DET}$ plotted as a function of frequency detuning (in Megahertz) from the |1> to |2> transition frequency. In the example of FIG. 3, the graph 306 is aligned with the graph 304 with respect to the frequency detuning. Therefore, as demonstrated in the graph 306, there is approximately zero phase shift at each of the transparency peak 308 associated with the electromagnetically induced transparency between states |1>, |2> and |3>, and the Autler-Townes transparency peaks 310. However, at very slight changes in the splitting field, the respective Autler-Townes transparency peaks 310 change frequency, and the detection beam $OPT_{DET}$ experiences significant phase shifts. As described herein, the sensor control system 210 is therefore configured to monitor the phase of the detection beam $OPT_{DET}$ to detect the external signal $RF_{EXT}$.

As described above, the first and second probe beams that form the combined probe beam $OPT_{CMB}$ can be respectively tuned to the frequencies associated with the Autler-Townes transparency peaks 310. Therefore, in the example of FIG. 3, the first and second probe beams that form the combined probe beam $OPT_{CMB}$ can be respectively tuned to the frequencies that are approximately +15 MHz and −15 MHz, respectively, detuned from the transparency peak 308 associated with the first Rydberg energy state. Therefore, in response to the external signal $RF_{EXT}$, the Autler-Townes transparency peaks 310 can move relative to the detuning demonstrated in the graph 306 (e.g., outward), and thus detuned farther from the frequency of the transparency peak 308. As a result, the detection beam $OPT_{DET}$ can exhibit a phase change in response to the presence of the external signal RFFEXT. The sensor control system 210 can thus detect the phase change to determine the presence of the external signal $RF_{EXT}$ based on monitoring the phase of the detection beam $OPT_{DET}$.

Figure 4:
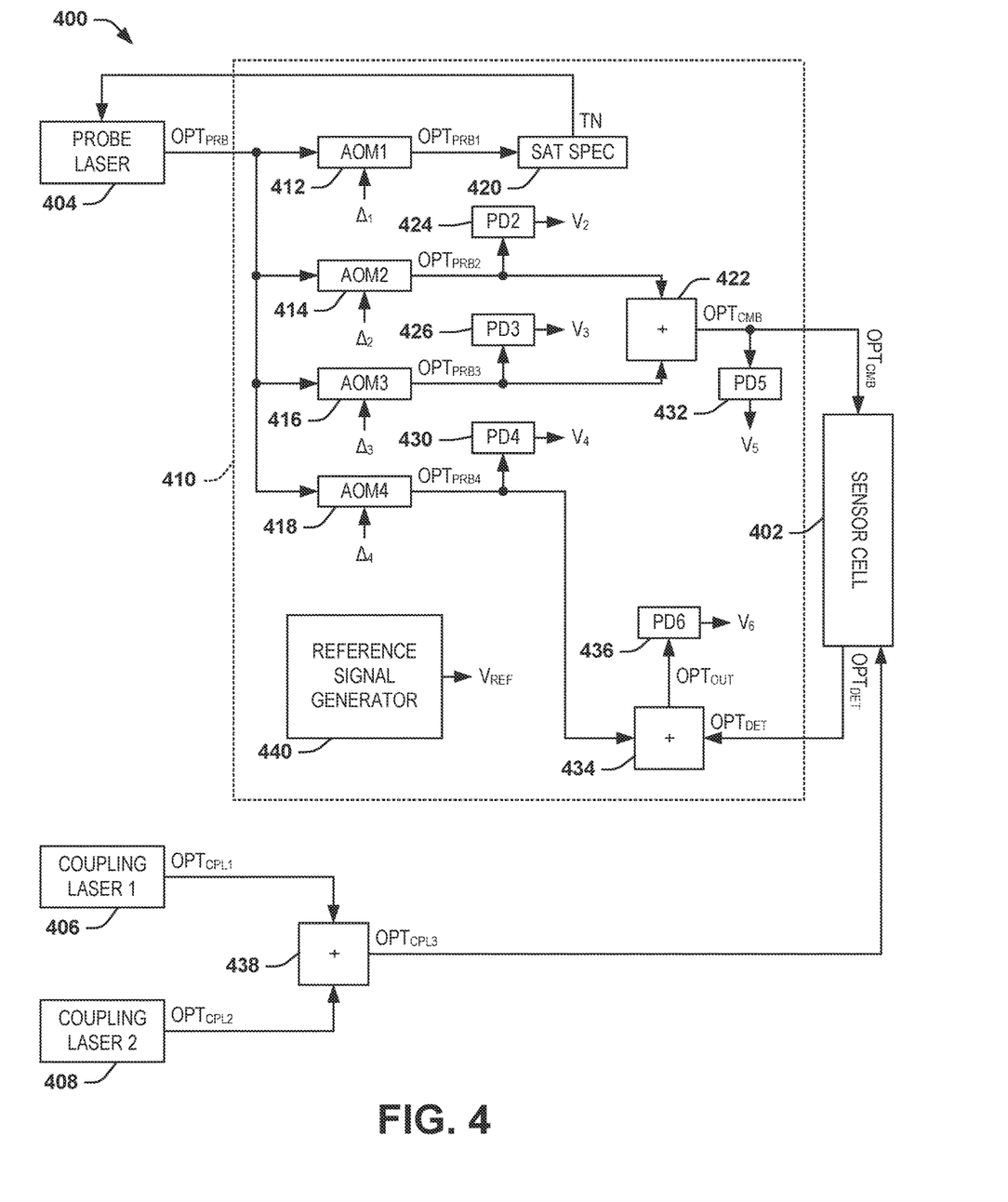
FIG. 4 illustrates another example of an electrometer system.

FIG. 4 illustrates another example of an electrometer system 400. The electrometer system 400 can correspond to a portion of the electrometer system 200 in the example of FIG. 2. Therefore, reference is to be made to the example of FIG. 3 in the following description of the example of FIG. 4.

The electrometer system 400 includes a sensor cell 402 that can be configured as a sealed glass container that includes an alkali metal vapor. The electrometer system 400 also includes a probe laser 404 that is configured to generate a probe beam $OPT_{PRB}$, a first coupling laser 406 that is configured to generate a first coupling beam $OPT_{CPL1}$ and a second coupling laser 408 that is configured to generate a first coupling beam $OPT_{CPL2}$. The probe beam $OPT_{PRB}$ is provided to a sensor control system 410. The sensor control system 410 is configured to split the probe beam $OPT_{PRB}$ into a plurality of different beams, such as based on a set of optics.

The probe beam $OPT_{PRB}$ is provided to a first acoustic optical modulator (AOM) 412 to generate a first probe beam $OPT_{PRB1}$, to a second AOM 414 to generate a second probe beam $OPT_{PRB2}$, to a third AOM 416 to generate a third probe beam $OPT_{PRB3}$, and to a fourth AOM 418 to generate a fourth probe beam $OPT_{PRB4}$. The first AOM 412 is configured to shift the probe beam $OPT_{PRB}$ by an amount $\Delta_1$ to provide the first probe beam $OPT_{PRB1}$. The first probe beam $OPT_{PRB1}$ is provided to a saturation spectroscopy element ("SAT SPEC") 420, which can correspond to a sensor cell that includes the same alkali metal atoms (e.g., Rb) as the sensor cell 402 and an associated spectroscopy detection system (e.g., including a first photodetector). Therefore, the saturation spectroscopy element 420 can be implemented to generate a tuning signal TN that is provided to the probe laser 404 to provide a frequency lock of the probe beam OPTPRB. As an example, the frequency of the probe beam OPTPRB can be locked to a frequency $\omega_{p,0}$ that is expressed as follows:

$$\omega_{p,1} = \omega_{p,0} - \Delta_1 \qquad \text{Equation 1}$$

Where: $\omega_{p,1}$ is the frequency of the first probe beam $OPT_{PRB1}$, and thus the transition frequency of the alkali metal atoms to the first excited state; and $\Delta_1$ is the frequency shift provided by the first AOM 412.

The second AOM 414 is configured to shift the probe beam $OPT_{PRB}$ by an amount $\Delta_2$ to provide the second probe beam $OPT_{PRB2}$. Similarly, the third AOM 416 is configured to shift the probe beam $OPT_{PRB}$ by an amount $\Delta_3$ to provide the third probe beam $OPT_{PRB3}$. Therefore, as an example, the frequency $\omega_{p,2}$ of the second probe beam $OPT_{PRB2}$ in response to the second AOM 414 and the frequency $\omega_{p,3}$ of the third probe beam $OPT_{PRB3}$ in response to the third AOM 416 can be expressed, respectively, as follows:

$$\omega_{p,2} = \omega_{p,1} + \Delta_2 = \omega_{p,0} - \Delta_1 + \Delta_2 \qquad \text{Equation 2}$$

$$\omega_{p,3} = \omega_{p,1} + \Delta_3 = \omega_{p,0} - \Delta_1 + \Delta_3 \qquad \text{Equation 3}$$

Where: $\Delta_2$ is the frequency shift provided by the second AOM 414; and $\Delta_3$ is the frequency shift provided by the third AOM 416.

The second and third probe beams $OPT_{PRB2}$ and $OPT_{PRB3}$ are provided to a beam combiner 422 that is configured to combine the second and third probe beams $OPT_{PRB2}$ and $OPT_{PRB3}$ to form the combined probe beam $OPT_{CMB}$. Additionally, the second probe beam $OPT_{PRB2}$ is provided to a second photodetector (e.g., photodiode) 424 and the third probe beam $OPT_{PRB3}$ is provided to a third photodetector 426. The second photodetector 424 is configured to generate a second detection signal $V_2$ corresponding to the intensity of the second probe beam $OPT_{PRB2}$ and the third photodetector 426 is configured to generate a third detection signal $V_3$ corresponding to the intensity of the third probe beam $OPT_{PRB3}$. The second and third detection signal $V_2$ and $V_3$ can be implemented as feedback for controlling the intensity of the respective second and third probe beams $OPT_{PRB2}$ and $OPT_{PRB3}$ to substantially cancel power intensity-related noise. The combined probe beam $OPT_{CMB}$ is provided through the sensor cell 402, similar to as described above in the example of FIG. 2 (e.g., via a set of optics) corresponding to the collinear second and third probe beams $OPT_{PRB2}$ and $OPT_{PRB3}$ (e.g., launched into a fiber). The combined probe beam $OPT_{CMB}$ is demonstrated as exiting the sensor cell 402 as the detection beam $OPT_{DET}$.

The fourth AOM 418 is configured to shift the probe beam $OPT_{PRB}$ by an amount 44 to provide the fourth probe beam $OPT_{PRB4}$. As an example, the frequency $\omega_{p,4}$ of the fourth probe beam $OPT_{PRB4}$ in response to the fourth AOM 418 can be expressed as follows:

$$\omega_{p,4} = \omega_{p,1} + \Delta_4 = \omega_{p,0} - \Delta_1 + \Delta_4 \qquad \text{Equation 4}$$

Where: $\Delta_4$ is the frequency shift provided by the fourth AOM 418.

In the example of FIG. 4, the fourth probe beam $OPT_{PRB4}$ is split to be provided to a fourth photodetector 430 that generates a fourth detection signal $V_4$ corresponding to the intensity of the fourth probe beam $OPT_{PRB4}$. The combined probe beam $OPT_{CMB}$ is provided to a fifth photodetector 432 that generates a fifth detection signal $V_5$ corresponding to the intensity of the combined probe beam OPTPRBCMB. Additionally, the fourth probe beam $OPT_{PRB4}$ is provided to a beam combiner 434 that is configured to combine the fourth probe beam $OPT_{PRB4}$ with the detection beam $OPT_{DET}$ to provide an output beam $OPT_{OUT}$. The output beam $OPT_{OUT}$ is provided to a sixth photodetector 436 that generates a sixth detection signal $V_6$ corresponding to the intensity of the output beam $OPT_{OUT}$.

In the example of FIG. 4, the coupling beams $OPT_{CPL1}$ and $OPT_{CPL2}$ are provided to a beam combiner 438 that combines the coupling beams $OPT_{CPL1}$ and $OPT_{CPL2}$ into a collinear beam $OPT_{CPL3}$. The collinear beam $OPT_{CPL3}$ is provided through the sensor cell 402 in a manner that is collinear and anti-parallel with the combined beam $OPT_{CMB}$ (e.g., via the beamsplitter 214 in the example of FIG. 2). Therefore, the combined beam $OPT_{CMB}$ and the collinear beam $OPT_{CPL3}$ can stimulate the alkali metal atoms to the first Rydberg energy state |4>, as described above in the example of FIG. 3. In the example of FIG. 4, the collinear beam $OPT_{CPL3}$ is demonstrated as separate from the detection beam $OPT_{DET}$ by example for ease in description, but that the associated optics can provide that the collinear beam $OPT_{CPL3}$ and the detection beam $OPT_{DET}$ are collinear and anti-parallel.

The sensor control system 410 is configured to detect the external signal $RF_{EXT}$ as follows. The voltage $V_5$ can be expressed as a beat note signal as follows:

$$V_5 \propto \langle [E_{v,2}\cos(\omega_{v,2}t + \phi_2^{path}) + E_{v,3}\cos(\omega_{v,3}t + \phi_3^{path})]^2 \rangle_T \qquad \text{Equation 5}$$

$$V_5 \propto \frac{E_{p,2}^2}{2} + \frac{E_{p,3}^2}{2} +$$

$$\langle 2E_{p,2}E_{p,3}\cos(\omega_{p,2}t + \phi_2^{path})\cos(\omega_{p,3}t + \phi_3^{path}) \rangle$$

$$V_5 \propto \frac{E_{p,2}^2}{2} + \frac{E_{p,3}^2}{2} +$$

$$\langle E_{p,2}E_{p,3}\cos((\omega_{p,2} + \omega_{p,3})t + \phi_2^{path} + \phi_3^{path}) \rangle +$$

$$\langle E_{v,2}E_{v,3}\cos((\omega_{p,2} - \omega_{p,3})t + \phi_2^{path} - \phi_3^{path}) \rangle$$

Where: $E_{p,2}$ is the electric field of the second probe beam $OPT_{PRB2}$;

$E_{p,3}$ is the electric field of the third probe beam $OPT_{PRB3}$;

$\phi_2^{path}$ is the phase of the optical path of the second probe beam $OPT_{PRB2}$;

$\phi_3^{path}$ is the phase of the optical path of the third probe beam $OPT_{PRB3}$.

In Equation 5, the summation terms in the arguments of the cosine quickly time-average to zero, while the difference frequencies can be tracked. Therefore, Equation 5 can be rewritten as follows:

$$V_5 \propto \frac{E_{p,2}^2}{2} + \frac{E_{p,3}^2}{2} + E_{p,2}E_{p,3}\cos((\omega_{p,2} - \omega_{p,3})t + \phi_2^{path} - \phi_3^{path}) \qquad \text{Equation 6}$$

In the example of FIG. 4, the sensor control system 410 includes a reference signal generator 440 that is configured to generate a reference signal $V_{REF}$. As an example, the reference signal $V_{REF}$ can have the same frequency as the fifth detection signal $V_5$. Thus, the fifth detection signal $V_5$ can be compared with the reference signal $V_{REF}$ as a beat note signal comparison to determine a difference between the phases of the signal paths $\phi_2^{path} - \phi_3^{path}$. Therefore, the phase difference of the signal paths $\phi_2^{path} - \phi_3^{path}$ can be solved for based on the comparison of the fifth detection signal $V_5$ with the reference signal $V_{REF}$.

The sixth detection signal $V_6$ can be expressed as follows:

$$V_6 \propto \qquad \text{Equation 7}$$

$$\langle [E'_{p,2}\cos(\omega_{p,2}t + \phi_{cell} + \phi_2^{path} + \phi_2^R) + E'_{p,3}\cos(\omega_{p,3}t + \phi_{cell} +$$

$$\phi_3^{path} + \phi_3^R) + E_{p,4}\cos(\omega_{p,4}t + \phi_4^{path})]^2 \rangle_T$$

$$V_6 \propto \langle [E'^2_{p,2}\cos^2(\omega_{p,2}t + \phi_{cell} + \phi_2^{path} + \phi_2^R) +$$

$$E'^2_{p,3}\cos^2(\omega_{p,3}t + \phi_{cell} + \phi_3^{path} + \phi_3^R)$$

$$+ E^2_{p,4}\cos^2(\omega_{p,4}t + \phi_4^{path})]^2 +$$

$$2E'_{p,2}E'_{p,3}\cos(\omega_{p,2}t + \phi_{cell} + \phi_2^{path} + \phi_2^R)$$

$$\cos(\omega_{p,3}t + \phi_{cell} + \phi_3^{path} + \phi_3^R) +$$

$$2E'_{p,2}E_{p,4}\cos(\omega_{p,2}t + \phi_{cell} + \phi_2^{path} + \phi_2^R)$$

$$\cos(\omega_{p,4}t + \phi_4^{path}) + 2E'_{p,3}E_{p,4}\cos$$

$$(\omega_{p,3}t + \phi_{cell} + \phi_3^{path} + \phi_3^R)\cos(\omega_{p,4}t + \phi_4^{path})\rangle_T$$

$$V_6 \propto \frac{E'^2_{p,2}}{2} + \frac{E'^2_{p,3}}{2} + \frac{E'^2_{p,4}}{2} + \langle 2E'_{p,2}E'_{p,3}\cos(\omega_{p,2}t +$$

$$\phi_{cell} + \phi_2^{path} + \phi_2^R)\cos($$

$$\omega_{p,3}t + \phi_{cell} + \phi_3^{path} + \phi_3^R) +$$

$$2E'_{p,2}E_{p,4}\cos(\omega_{p,2}t + \phi_{cell} +$$

$$\phi_2^{path} + \phi_2^R)\cos(\omega_{p,4}t + \phi_4^{path}) +$$

$$2E'_{p,3}E_{p,4}\cos(\omega_{p,3}t + \phi_{cell} +$$

$$\phi_3^{path} + \phi_3^R)\cos(\omega_{p,4}t + \phi_4^{path})\rangle$$

$$V_6 \propto \frac{E'^2_{p,2}}{2} + \frac{E'^2_{p,3}}{2} + \frac{E'^2_{p,4}}{2} + \langle E'_{p,2}E'_{p,3}\cos((\omega_{p,2} + \omega_{p,3})t +$$

$$2\phi_{cell} + \phi_2^{path} + \phi_3^{path} + \phi_2^R + \phi_3^R)\rangle +$$

$$\langle E'_{p,2}E'_{p,3}\cos((\omega_{p,2} - \omega_{p,3})t + \phi_2^{path} -$$

$$\phi_3^{path} + \phi_2^R - \phi_3^R)\rangle +$$

$$\langle E'_{p,2}E_{p,4}\cos((\omega_{p,2} + \omega_{p,4})t + \phi_{cell} +$$

$$\phi_2^{path} + \phi_4^{path} + \phi_2^R)\rangle +$$

-continued $$\langle E'_{p,2}E_{p,4}\cos((\omega_{p,2}-\omega_{p,4})t+\phi_{cell}+$$
$$\phi_2^{path}-\phi_4^{path}+\phi_2^R)\rangle +$$
$$\langle E'_{p,3}E_{p,4}\cos((\omega_{p,3}+\omega_{p,4})t+\phi_{cell}+$$
$$\phi_3^{path}+\phi_4^{path}+\phi_3^R)\rangle +$$
$$\langle E'_{p,3}E_{p,4}\cos((\omega_{p,3}-\omega_{p,4})t+\phi_{cell}+\phi_3^{path}-\phi_4^{path}+\phi_3^R)\rangle^T$$

Where: $E'_{p,2}$ is the attenuated electric field of the second probe beam $OPT_{PRB2}$, as provided in the detection beam $OPT_{DET}$;

$E'_{p,3}$ is the electric field of the third probe beam $OPT_{PRB3}$, as provided in the detection beam $OPT_{DET}$;

$\phi_{cell}$ is the phase change resulting from the sensor cell 402;

$\phi_2^R$ is the phase of the second probe beam $OPT_{PRB2}$ relative to one of the Autler-Townes transparency peaks, as provided in the detection beam $OPT_{DET}$;

$\phi_3^R$ is the phase of the third probe beam $OPT_{PRB3}$ relative to the other one of the Autler-Townes transparency peaks, as provided in the detection beam $OPT_{DET}$;

$E_{p,4}$ is the electric field of the fourth probe beam $OPT_{PRB4}$;

$\phi_4^{path}$ is the phase of the optical path of the fourth probe beam $OPT_{PRB4}$.

Similar to as described above regarding the fifth detection signal $V_5$, in Equation 7, the summation terms in the arguments of the cosine quickly time-average to zero, while the difference frequencies can be tracked. Therefore, Equation 7 can be rewritten as follows:

$$V_6 \propto \frac{E'^2_{p,2}}{2}+\frac{E'^2_{p,3}}{2}+\frac{E'^2_{p,4}}{2}+ \quad \text{Equation 8}$$
$$E'_{p,2}E'_{p,3}\cos((\omega_{p,2}-\omega_{p,3})t+\phi_2^{path}-\phi_3^{path}+\phi_2^R-\phi_3^R)+$$
$$E'_{p,2}E'_{p,4}\cos((\omega_{p,2}-\omega_{p,4})t+\phi_{cell}+\phi_2^{path}-\phi_4^{path}+\phi_2^R)+$$
$$E'_{p,3}E'_{p,4}\cos((\omega_{p,3}-\omega_{p,4})t+\phi_{cell}+\phi_3^{path}-\phi_4^{path}+\phi_3^R)$$

$$V_6 \propto \frac{E'^2_{p,2}}{2}+\frac{E'^2_{p,3}}{2}+\frac{E'^2_{p,4}}{2}+$$
$$E'_{p,2}E'_{p,3}\cos((\omega_{p,0}-\Delta_1+\Delta_2-(\omega_{p,0}-\Delta_1+\Delta_3))t+$$
$$\phi_2^{path}-\phi_3^{path}+\phi_2^R-\phi_3^R)+$$
$$E'_{p,2}E_{p,4}\cos((\omega_{p,0}-\Delta_1+\Delta_2-(\omega_{p,0}-\Delta_1+\Delta_4))t+$$
$$\phi_{cell}+\phi_2^{path}-\phi_4^{path}+\phi_2^R)+$$
$$E'_{p,3}E_{p,4}\cos((\omega_{p,0}-\Delta_1+\Delta_3-(\omega_{p,0}-\Delta_1+\Delta_4))t+$$
$$\phi_{cell}+\phi_3^{path}-\phi_4^{path}+\phi_3^R)$$

$$V_6 \propto \frac{E'^2_{p,2}}{2}+\frac{E'^2_{p,3}}{2}+\frac{E'^2_{p,4}}{2}+E'_{p,2}E'_{p,3}$$
$$\cos((\Delta_2-\Delta_3)t+\phi_2^{path}-\phi_3^{path}+\phi_2^R-\phi_3^R)+$$
$$E'_{p,2}E'_{p,4}\cos((\Delta_2-\Delta_4)t+\phi_{cell}+\phi_2^{path}-\phi_4^{path}+\phi_2^R)+$$
$$E'_{p,3}E'_{p,4}\cos((\Delta_3-\Delta_4)t+\phi_{cell}+\phi_3^{path}-\phi_4^{path}+\phi_3^R)$$

In evaluating Equation 8, based on the fourth detection signal $V_4$ provided from the fourth photodetector 430, $E_{p,4}$ can be identified. Therefore, as long as the expression $\Delta_2-\Delta_4 \neq \Delta_3-\Delta_4$ is valid, then the values for $E'_{p,2}$ and $E'_{p,3}$ can be identified. The values of $E'_{p,2}$ and $E_{p,3}$ can be fed back as approximately equal values to control the value of the frequency shift $\Delta_1$. Therefore, the Autler-Townes transparency peaks 310 can be maintained at approximately equal magnitudes, and thus symmetric about the first Rydberg energy state transparency peak 308. Accordingly, frequency variations can be canceled in the determination of the phase of the detection beam $OPT_{DET}$.

Based on the detection signal $V_5$, the expression $\phi_2^{path}-\phi_3^{path}$ is known before the second and third probe beams $OPT_{PRB2}$ and $OPT_{PRB3}$ are combined by the beam combiner 422. After the second and third probe beams $OPT_{PRB2}$ and $OPT_{PRB3}$ are combined to form the combined beam $OPT_{CMB}$, the expression $\phi_2^{path}-\phi_3^{path}$ is equal to zero. Therefore, the term in the detection signal $V_6$ that oscillates as $\Delta_2-\Delta_3$ is beat in the electronics of the sensor control system 410 against the reference signal $V_{REF}$. Accordingly, the result is determinative of the expression $\phi_2^R-\phi_3^R$.

With no external signal $RF_{EXT}$ being present, the splitting signal $RF_{SPL}$ is selected such that the expression $\phi_2^R-\phi_3^R=0$. However, when the external signal $RF_{EXT}$ is present, the Autler-Townes transparency peaks 310 move in opposing directions (either converging or diverging in the frequency spectrum), thus providing $\phi_2^R-\phi_3^R=0$. Any noise that, may causes the Autler-Townes transparency peaks 310 to move in the same direction (such as frequency noise associated with the probe laser 404) can be suppressed because $\phi_2^R-\phi_3^R$ is still zero.

Therefore, amplitude modulation of the external signal $RF_{EXT}$ results in modulation of the separation of the Autler-Townes transparency peaks 310. As a result, the sensor control system 410 can detect a non-zero value of $\phi_2^R-\phi_3^R$, which can be implemented to detect the external signal $RF_{EXT}$. Furthermore, phase and frequency modulation can be translated by the sensor control system 410 into amplitude modulation when the external signal $RF_{EXT}$ combines with the known splitting signal RFSPL at the alkali atoms. Accordingly, the sensor control system 410 can identify the signal characteristics of the external signal $RF_{EXT}$.

Figure 5:
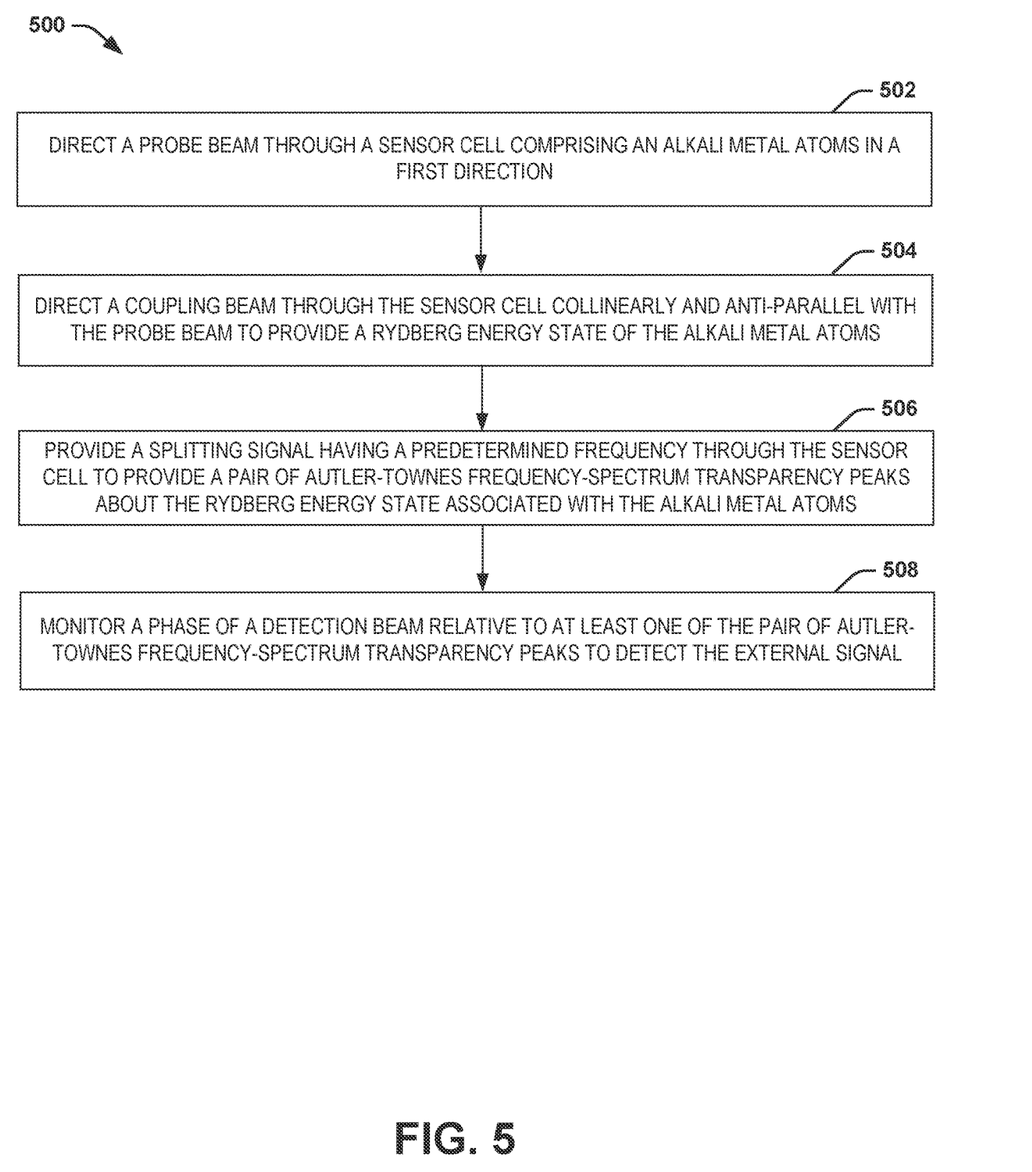
FIG. 5 illustrates an example of a method for detecting an external signal via an electrometer system.

In view of the foregoing structural and functional features described above, a methodology in accordance with various aspects of the disclosure will be better appreciated with reference to FIG. 5. It is to be understood and appreciated that the method of FIG. 5 is not limited by the illustrated order, as some aspects could, in accordance with the present disclosure, occur in different orders and/or concurrently with other aspects from that shown and described herein. Moreover, not all illustrated features may be required to implement a methodology in accordance with an aspect of the present examples.

FIG. 5 illustrates an example of a method 500 for detecting an external signal (e.g., the external signal $RF_{EXT}$) via an electrometer system (e.g., the electrometer system 100). At 502, a probe beam (e.g., the probe beam $OPT_{PRB}$) is directed through a sensor cell (e.g., the sensor cell 102) comprising an alkali metal atoms in a first direction. At 504, a coupling beam(s) (e.g., the coupling beam(s) $OPT_{CPL}$) is directed through the sensor cell collinearly and anti-parallel with the probe beam to provide a Rydberg energy state of the alkali metal atoms. At 506, a splitting signal (e.g., the splitting signal $RF_{SPL}$) having a predetermined frequency is provided through the sensor cell to provide a pair of Autler-Townes frequency-spectrum transparency peaks associated with the alkali metal atoms. At 508, a phase of a detection beam (e.g., the detection beam $OPT_{DET}$) is monitored relative to at least one of the pair of Autler-Townes frequency-spectrum transparency peaks. The detection beam can correspond to the probe beam exiting the sensor cell.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. An electrometer system comprising:
   a sensor cell comprising alkali metal atoms within;
   a probe laser configured to generate a probe beam, the probe beam being provided through the sensor cell;
   a coupling laser configured to generate a coupling beam, the coupling beam being provided through the sensor cell to combine with the probe beam provided through the sensor cell to provide a Rydberg energy state of the alkali metal atoms, the probe beam exiting the sensor cell as a detection beam; and
   a sensor control system configured to monitor the detection beam to detect an external signal based on monitoring a phase of the detection beam.

2. The system of claim 1, further comprising a splitting signal generator configured to generate a splitting signal having a predetermined frequency through the sensor cell to provide a pair of Autler-Townes frequency-spectrum transparency peaks about the Rydberg energy state associated with the alkali metal atoms, wherein the sensor control system is configured to detect the external signal based on the phase of the detection beam associated with at least one of the pair Autler-Townes frequency-spectrum transparency peaks.

3. The system of claim 1, wherein the sensor control system is configured to split the probe beam into a first probe beam and a second probe beam that are each provided through the sensor cell as a combined optical beam, the first and second probe beams having respective frequencies that are approximately equal and opposite a frequency-spectrum transparency peak associated with the Rydberg energy state, wherein the detection beam corresponds to the combined optical beam exiting the sensor cell.

4. The system of claim 3, wherein the sensor control system comprises:
   a first photodetector configured to monitor the combined optical beam at the input of the sensor cell; and
   a second photodetector configured to monitor the detection beam at the output of the sensor cell, such that the sensor control system is configured to compare the monitored combined optical signal with the monitored detection beam to factor out a relative signal path phase difference between the first and second probe beams.

5. The system of claim 4, wherein the sensor control system further includes a reference signal generator configured to generate a reference signal, wherein the monitored combined optical signal is compared with the reference signal to generate a first beat signal and the monitored detection beam is compared with the reference signal to generate a second beat signal, such that the sensor control system is configured to compare the monitored combined optical signal with the monitored detection beam based on comparing the first and second beat signals.

6. The system of claim 3, wherein the sensor control system is configured to split the probe beam into the first probe beam, the second probe beam, and a third probe beam, the third probe beam being combined with the detection beam to determine a power associated with the first and second probe beams to stabilize a frequency associated with the Rydberg energy state of the alkali metal atoms.

7. The system of claim 3, further comprising a splitting signal generator configured to generate a splitting signal having a predetermined frequency through the sensor cell to provide a pair of Autler-Townes frequency-spectrum transparency peaks about the Rydberg energy state associated with the alkali metal atoms, wherein the sensor control system is configured to detect the external signal based on the phases of the first and second probe beams relative to the respective pair of Autler-Townes frequency-spectrum transparency peaks, as provided in the detection beam.

8. The system of claim 1, wherein the coupling beam is a first coupling beam, the system further comprising a second coupling beam, wherein the first and second coupling beams are combined to form a combined coupling beam that is provided through the sensor cell to combine with the probe beam provided through the sensor cell to provide the Rydberg energy state of the alkali metal atoms.

9. The system of claim 1, further comprising optics configured to collimate the probe beam and the coupling beam to provide the probe beam and the coupling beam to be collinear and anti-parallel with respect to each other, such that the sensor control system is configured to monitor the detection beam along an axis through the sensor cell to detect the external signal.

10. A method for detecting an external signal via an electrometer system, the method comprising:
    directing a probe beam through a sensor cell comprising an alkali metal atoms in a first direction;
    directing a coupling beam through the sensor cell collinearly and anti-parallel with the probe beam to provide a Rydberg energy state of the alkali metal atoms;
    providing a splitting signal having a predetermined frequency through the sensor cell to provide a pair of Autler-Townes frequency-spectrum transparency peaks about the Rydberg energy state associated with the alkali metal atoms; and
    monitoring a phase of a detection beam relative to at least one of the pair of Autler-Townes frequency-spectrum transparency peaks to detect the external signal, the detection beam corresponding to the probe beam exiting the sensor cell.

11. The method of claim 10, further comprising:
    splitting the probe beam into a first probe beam and a second probe beam that are each provided through the sensor cell as a combined optical beam, wherein the detection beam corresponds to the combined optical beam exiting the sensor cell; and
    setting the first and second probe beams to have respective frequencies that are approximately equal to frequencies associated with the respective pair of Autler-Townes frequency-spectrum transparency peaks.

12. The method of claim 11, further comprising:
    monitoring the combined optical signal at the input of the sensor cell;
    monitoring the detection beam at the output of the sensor cell; and comparing the monitored combined optical signal with the monitored detection beam to factor out a relative signal path phase difference between the first and second probe beams.

13. The method of claim 12, further comprising generating a reference signal, wherein comparing the monitored combined optical signal with the monitored detection beam comprises:
comparing the monitored combined optical signal with the reference signal to generate a first beat signal;
comparing the monitored detection beam is compared with the reference signal to generate a second beat signal; and
comparing the monitored combined optical signal with the monitored detection beam based on comparing the first and second beat signals.

14. The method of claim 12, further comprising:
splitting the probe beam into the first probe beam, the second probe beam, and a third probe beam;
combining the third probe beam with the detection beam;
determining a power associated with the first and second probe beams based on the monitored detection beam; and
stabilizing a frequency associated with the Rydberg energy state of the alkali metal atoms based on the power associated with the first and second probe beams.

15. The method of claim 12, wherein directing the coupling beam comprises:
combining a first coupling beam and a second coupling beam to generate a combined coupling beam; and
providing the combined coupling beam through the sensor cell collinearly and anti-parallel with the probe beam to provide a Rydberg energy state of the alkali metal atoms.

16. An electrometer system comprising:
a sensor cell comprising alkali metal atoms within;
a probe laser configured to generate a probe beam;
a coupling laser configured to generate a coupling beam that is provided through the sensor cell;
a splitting signal generator configured to generate a splitting signal having a predetermined frequency through the sensor cell to provide a pair of Autler-Townes frequency-spectrum transparency peaks associated with the alkali metal atoms; and
a sensor control system configured to split the probe beam into a first probe beam and a second probe beam that are each provided through the sensor cell as a combined optical beam and exiting the sensor cell as a detection beam, the first and second probe beams having respective frequencies that are approximately equal to frequencies associated with the respective pair of Autler-Townes frequency-spectrum transparency peaks, the combined optical beam and the coupling beam providing a Rydberg energy state of the alkali metal atoms, the sensor control system being further configured to monitor the detection beam to detect an external signal based on monitoring a phase of the detection beam with respect to at least one of the Autler-Townes frequency-spectrum transparency peaks.

17. The system of claim 16, wherein the sensor control system comprises:
a first photodetector configured to monitor the combined optical signal at the input of the sensor cell; and
a second photodetector configured to monitor the detection beam at the output of the sensor cell, such that the sensor control system is configured to compare the monitored combined optical signal with the monitored detection beam to factor out a relative signal path phase difference between the first and second probe beams.

18. The system of claim 17, wherein the sensor control system further includes a reference signal generator configured to generate a reference signal, wherein the monitored combined optical signal is compared with the reference signal to generate a first beat signal and the monitored detection beam is compared with the reference signal to generate a second beat signal, such that the sensor control system is configured to compare the monitored combined optical signal with the monitored detection beam based on comparing the first and second beat signals.

19. The system of claim 16, wherein the sensor control system is configured to split the probe beam into the first probe beam, the second probe beam, and a third probe beam, the third probe beam being combined with the detection beam to determine a power associated with the first and second probe beams to stabilize a frequency associated with the Rydberg energy state of the alkali metal atoms.

20. The system of claim 16, wherein the coupling beam is a first coupling beam, the system further comprising a second coupling beam, wherein the first and second coupling beams are combined to form a combined coupling beam that is provided through the sensor cell to combine with the probe beam provided through the sensor cell to provide the Rydberg energy state of the alkali metal atoms.

* * * * *